(12) United States Patent
Arkin

(10) Patent No.: US 6,256,757 B1
(45) Date of Patent: Jul. 3, 2001

(54) APPARATUS FOR TESTING MEMORIES WITH REDUNDANT STORAGE ELEMENTS

(75) Inventor: Brian J. Arkin, Pleasanton, CA (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/491,478

(22) Filed: Jan. 24, 2000

(51) Int. Cl.[7] .................................................. G11C 29/00
(52) U.S. Cl. .......................... 714/718; 714/710; 714/711; 714/742
(58) Field of Search ...................... 714/710, 711, 714/54, 718, 754, 744, 742; 365/201; 361/189.05, 189.07

(56) References Cited

U.S. PATENT DOCUMENTS

| | | | |
|---|---|---|---|
| 4,833,652 | * 5/1989 | Isobe et al. | 365/201 |
| 5,481,550 | * 1/1996 | Garcia et al. | 714/744 |
| 5,495,447 | * 2/1996 | Butler et al. | 365/200 |
| 5,795,797 | * 8/1998 | Chester et al. | 438/4 |
| 6,065,141 | * 5/2000 | Kitagawa | 714/711 |
| 6,072,737 | * 6/2000 | Morgan et al. | 365/201 |

* cited by examiner

Primary Examiner—Emmanuel L. Moise
(74) Attorney, Agent, or Firm—Daniel J. Bedell; Smith-Hill and Bedell

(57) ABSTRACT

A memory tester tests a random access memory device under test (DUT) comprising addressable rows and columns of memory cells, and provides a host computer with enough information to determine how to efficiently allocate spare rows and columns for replacing rows and columns containing defective memory cells. During a test the memory tester writes a bit into each address of an error capture memory (ECM) to indicate whether a correspondingly addressed memory cell of the DUT is defective. The tester also counts of the number of memory cells of each row and column that are defective. After the test the counts are supplied to the host computer. When the host computer is unable to determine how to allocate the spare rows and columns from the counts alone, it requests the tester to process the data in the ECM to determine and supply the host computer with addresses of the defective memory cells.

10 Claims, 3 Drawing Sheets

APPARATUS FOR TESTING MEMORIES WITH REDUNDANT STORAGE ELEMENTS

BACKGROUND OF THE INVENTION

1. Field of the Invention

The present invention relates in general to memories having spare rows and columns of memory cells that can be used to replace rows and columns having defective cells, and in particular to an apparatus for testing such a memory and generating data for facilitating allocation of spare rows and columns.

2. Description of Related Art

A typical random access memory (RAM) includes an array of rows and columns of memory cells, each cell having a unique combination of row and column address. Many RAMs include redundant storage elements in the form of spare rows and columns of memory cells. When such a RAM is found to have a defective memory cell, a row or column containing that memory cell can be replaced with one of the RAM's spare rows or columns. The replacement is accomplished by using a laser or other means to alter the RAM so that the spare row or column is addressed in lieu of the row or column containing the defective cell.

When such a RAM has a defective cell it can be repaired by replacing either its row or column with a spare row or column. However it is important to allocate spare rows and columns efficiently. For example assume a RAM has one spare row and three spare columns. Assume also that the RAM has 6 defective cells with three of them occurring in its first row. If we replace the first row with the spare row, then we can use the three spare columns to replace columns containing the three defective cells that are not in the first row. However if we use the three spare columns to replace the columns containing the three cells in the first row, we may not have enough remaining spare rows and columns to replace the three cells that are not in the first row.

Prior art memory testers typically test each memory cell of a RAM device under test (DUT) by writing data to the memory cell and then reading the data back out to determine whether the data read out matches the data written into the cell. A high speed memory tester employs a pattern generator or counters to produce the data, address and control signals needed to write data into the memory cells and read it back out. A hardware comparator typically compares the memory input and output data and supplies data indicating the result of the comparison to an "error capture memory" having one storage memory for each memory cell to store the results of the comparison. After each memory cell of the DUT has been tested, the contents of the error capture memory constitutes a bit map of the DUT, with each bit indicating whether a corresponding memory cell of the DUT is defective. Following the test, a host computer reads the contents of the error capture memory and determines therefrom how best to allocate spare rows and columns when replacing the defective memory cells.

One problem with this system is that since the error capture memory has to have as many cells as the memory being tested, and since memories can be quite large, it takes a relatively long time for the host computer to read all of the data out of the error capture memory. In a production environment where thousands of memories are being tested in succession, the total time the host computer requires to read the captured error data is substantial and comprises a significant portion of the time required to test the memories.

Thus it would be beneficial to provide a memory test system that can quickly test a memory and quickly provide a host computer with a relatively small amount of data that will enable the host computer to determine how to allocate spare rows and columns, and which does not require the host computer to read the entire contents of an error capture memory.

SUMMARY OF THE INVENTION

A memory tester in accordance with the invention quickly tests a random access memory device under test (DUT) comprising addressable rows and columns of memory cells, and quickly provides a host computer with enough information to determine how to efficiently allocate spare rows and columns for replacing rows and columns containing defective memory cells.

During a test the memory tester tests each memory cell of the DUT and writes a bit into each address of an error capture memory (ECM) to indicate whether a correspondingly addressed memory cell of the DUT is defective.

In accordance with one aspect of the invention, the tester also counts of the number of defective memory cells in each row and column. After the test the count for each row and column is supplied to the host computer. In many cases, the host computer will be able to determine how to allocate spare rows and columns to replace DUT rows and columns containing defective memory cells on the basis of the count data alone.

In accordance with another aspect of the invention, in cases where the host computer is unable to determine how to allocate the spare rows and columns from the count data alone, it requests the tester to process the data in the ECM to determine and supply the host computer with particular addresses of the defective memory cells. The host computer is then able to determine how to allocate spare rows and columns on the basis of this address data.

The memory tester in accordance with the invention provides the necessary information to the host computer more quickly than typical prior art testers because it presents the information in a compact form and because it does not require a host computer to directly read access every storage location in the ECM to determine which cells are defective. In most cases the test process ends after the host computer acquires the relatively small amount of row and column error count data because the host computer will be able to determine a suitable allocation for spare rows and columns based solely on that data. Even when the host computer cannot determine how to allocate spare rows and column on the basis of the count data, it does not read and process the contents of the ECM. This is done by hardware within tester which can do so more quickly. Moreover, not all storage locations in the ECM are read. In accordance with a further aspect of the invention, the tester reads and processes data from only the rows (or columns) of the ECM that correspond to rows or columns of DUT containing defective cells.

It is accordingly an object of the invention to quickly test a memory having spare rows and columns and to quickly provide a host computer with a small amount of data that is sufficient to enable it to determine how to efficiently allocate spare rows and columns to replace rows and columns containing defective memory cells.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
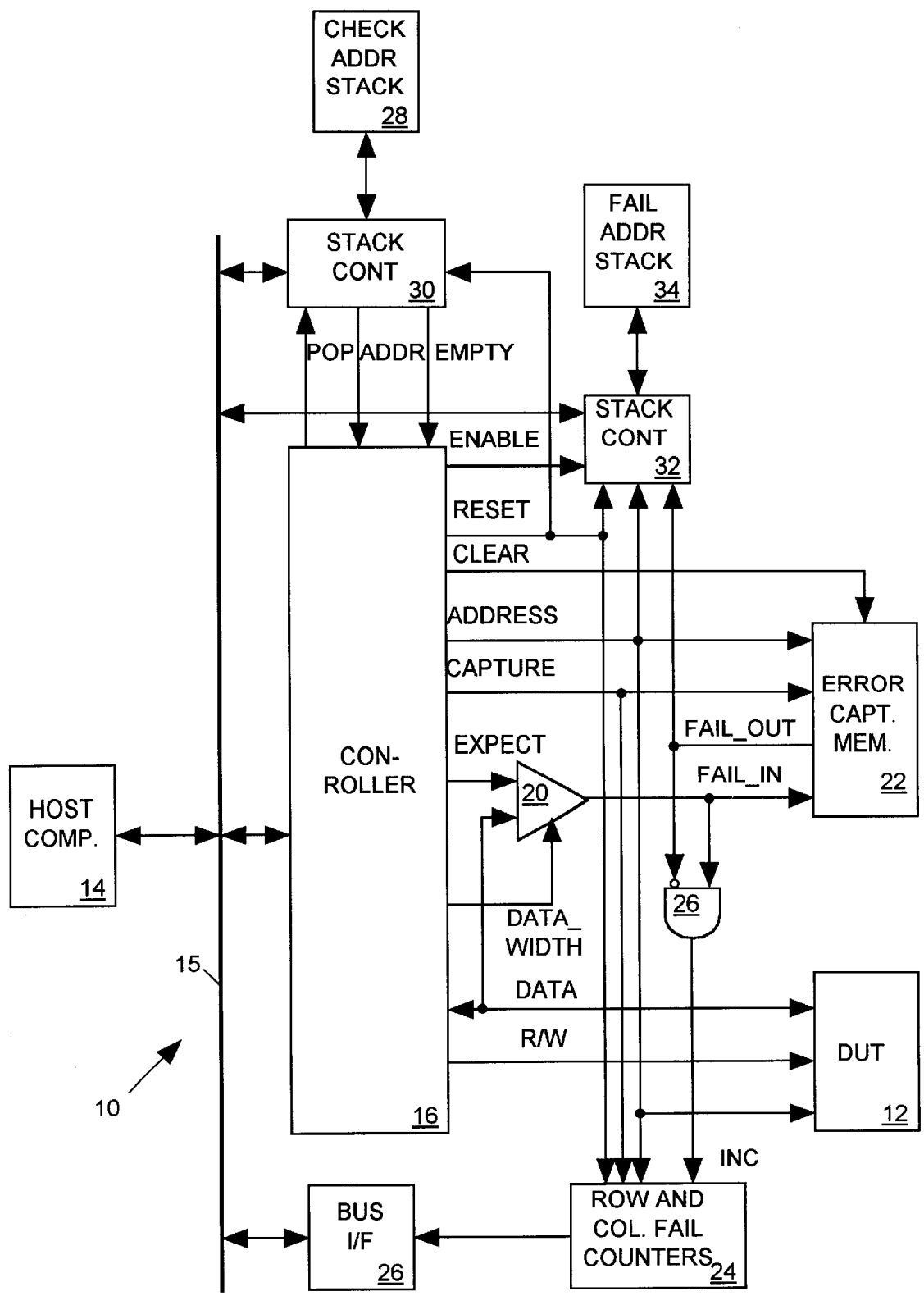
FIG. 1 illustrates in block diagram form a memory tester 10 in accordance with the present invention for testing a random access memory.

FIG. 1 illustrates in block diagram form a memory tester 10 in accordance with the present invention for testing a random access memory device under test (DUT) 12. DUT 12 includes an array of rows and columns of memory cells, each cell having a unique combination of row and column address. DUT 12 also includes several spare rows and columns. When RAM 12 is found to have defective memory cells, rows or columns containing those defective memory cells can be replaced with the spare rows and columns. The replacement may be carried out, for example, by using a laser or other means to modify the RAM so that a spare row or column is addressed in lieu of a row or column containing the defective cell. Memory tester 10 tests DUT 12 to determine which cells of DUT are defective and provides data indicating test results to a host computer 14 via a conventional computer bus 15. Host computer 14 determines how to allocate the DUT's spare rows and columns based on the test results data.

Memory Testing

When DUT 12 is in position and ready to be tested, host computer 14 transmits a "TEST" command to a controller 16 within tester 10 via bus 15 telling it to start the test. Controller 16 then starts the test of DUT 12. Memory tester 10 tests DUT 12 by writing data into each memory cell of DUT 12, reading the data back out of the memory cell, and comparing the memory's input and output data. If the input and output data don't match, the cell is defective. Tester 10 checks all memory cells at least twice to make sure they can properly store and read back both a logical "0" a logical "1" in each bit position.

Figure 2:
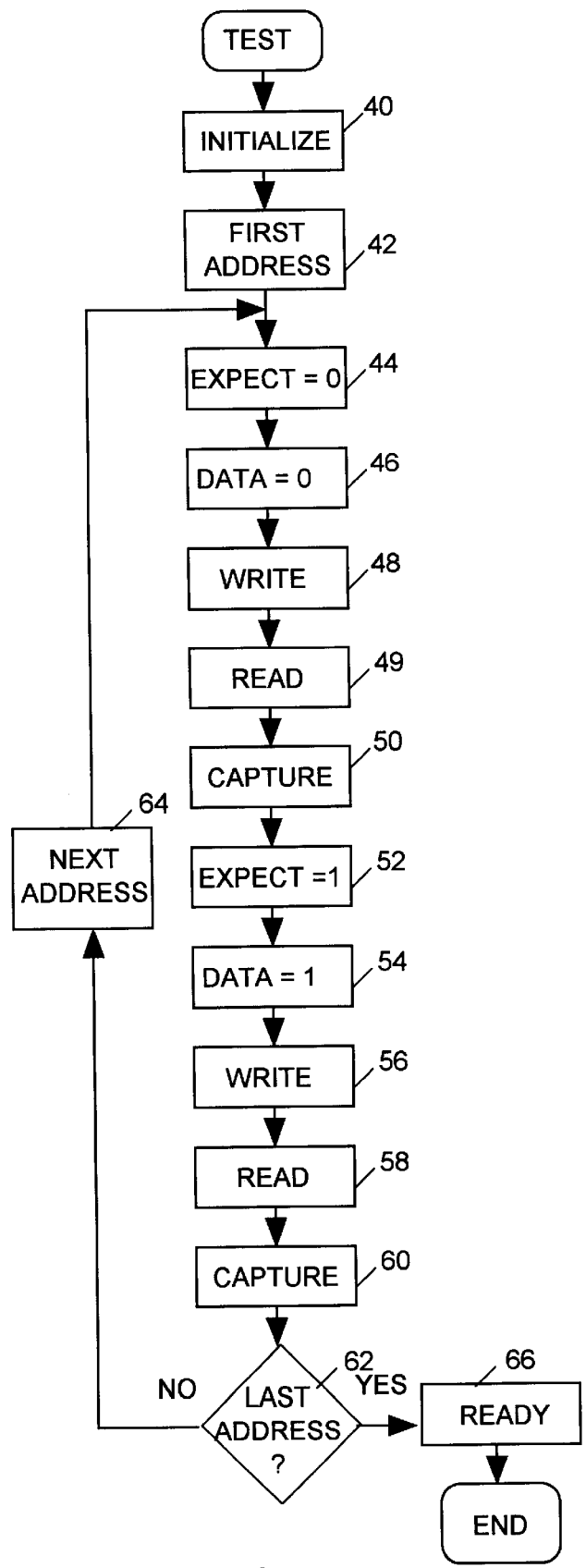
FIG. 2 is a flow chart indicating a manner in which the controller of the memory tester responds to a TEST command.

FIG. 2 is a flow chart indicating how controller 16 responds to the TEST command. Upon receiving the TEST command, controller 16 initializes tester 10 (step 40) in a manner described below. Controller 16 then supplies the address of the first cell of the first row as an address input (ADDRESS) to DUT 12 (step 42), sets each bit of and EXPECT data value to a logical 0 (step 44) and sets each bit of data (DATA) on a data bus input to DUT 12 to a logical 0 (step 46). Controller 16 then sets a read/write control signal (R/W) input to DUT 12 to tell it to write its current DATA input into the address indicated by its current ADDRESS input (step 48). Thereafter, controller 16 sets the R/W to tell DUT 12 to read the stored data back out onto the DATA bus (step 49). Comparator 20 compares the EXPECT data to the data read out of DUT 12 and generates a FAIL_IN signal of a logical "0" state when the two data values match and of a logical "1" state when the two data values fail to match.

Tester 10 of FIG. 1 includes an error capture memory (ECM) 22 that also receives the ADDRESS input to DUT 12. ECM 22 has a separate single-bit storage location corresponding to each memory cell of DUT 12 and having the same address as the memory cell. During the initialization process (step 40) controller 16 writes a "0" to each storage location of ECM 22. After comparator 20 has set the state of its output FAIL_IN signal controller 16 pulses a read/write control signal (CAPTURE) input to ECM 22 (step 50). If the FAIL_IN output of comparator 20 is a "1" then ECM 22 writes a "1" to its currently addressed storage location. However if the FAIL_IN bit is a "0", ECM 22 does not write a data bit to the currently addressed storage location.

Controller 16 then sets each bit of the EXPECT data corresponding to each I/O pin of DUT 12 to a "1" (step 52), sets each bit of the data on the DATA bus to all 1's (step 54), signals DUT 12 to write the data to its currently addressed cell (step 56), and then signals DUT 12 to read the data back out onto the DATA bus (step 58). Controller 16 thereafter again pulses the CAPTURE signal (step 60). At this point the FAIL_IN data output of comparator will be a 0 if the DUT's DATA output matches the EXPECT data (all 1's) and will otherwise be a 1 if the DUT's DATA output fails to match the EXPECT data. When controller 16 thereafter again pulses the CAPTURE signal (step 60), ECM 22 responds by storing a 1 in its currently addressed storage location if the FAIL_IN bit is a "1" true and by otherwise leaving the contents of the storage location unchanged.

Thus following step 60 the contents of the currently addressed storage location of ECM 22 will be a "0" if the corresponding cell of DUT 12 properly stores and reads out both 0's and 1's and will be a "1" if the corresponding DUT cell otherwise fails to properly store and read out either 0's or 1's.

When the current ADDRESS input to DUT 12 is not the last address to be tested (step 62), controller 16 sets the ADDRESS input to address a next address to be tested (step 64) and then repeats steps 44 through 60 to test that next address of DUT 12, thereby causing ECM 22 to store a 1 or a 0bit in a next storage location to indicate whether the next addressed cell of DUT 12 is defective. Steps 44–64 are repeated for each memory cell of DUT 12 so that after the last memory address of DUT 12 has been tested, the contents of ECM 12 constitutes a bit map of the defective cells of DUT 12. At that point controller 16 transmits a READY command to host computer 14 (step 66) via bus 15 to tell the host computer that it has finished testing DUT 12.

Tester 10 also includes a set of addressable counters 24, one for each row and each column of DUT 12. During initialization step 40 (FIG. 2), controller 16 pulses a RESET signal that resets (zeros) the counts of all counters 24. Thereafter, during the test, each counter 24 counts the number of failed cells in its corresponding row or column. In doing so, each counter 24 monitors the ADDRESS bus and enables its count when its corresponding row or column of DUT 12 is addressed. Thus whenever controller 16 puts an address of a memory cell on the ADDRESS bus, two counters 24 are enabled, the counter corresponding to the memory cell's row and the counter corresponding to the memory cell's column. Each counter 24 receives an increment signal (INC) produced by an AND gate 26. AND gate 26 receives the FAIL_IN output of comparator 20 at a non-inverting input and receives at an inverting input the contents (FAIL_OUT) of the currently addressed ECM storage location. Immediately before controller 16 pulses the CAPTURE signal, the output of AND gate 26 is a "1" if the FAIL_IN signal is a "1" and the contents (FAIL_OUT) of the currently addressed ECM cell is a "0". Otherwise the INC bit is a "0". Each counter 24 receives the CAPTURE signal produced by controller 16 at steps 50 and 60 (FIG. 2). The currently enabled counters 24 corresponding to the row and column of the currently addressed DUT 12 cell increment their counts in response to the leading edge of the CAPTURE signal pulse when the INC signal input is a "1" and otherwise refrain from incrementing their counts. Thus although a cell may fail both the "0" and "1" read/write tests the counters 24 corresponding to the cell's row and column count only the first detected failure. Therefore, at the end of the test, the count maintained by each counter 24 indicates the number of cells within the corresponding row or column that are defective.

Error Count Analysis

A conventional bus interface circuit 27 permits host computer 14 to read the output count of each row and column fail counter 24 which appear as addressable data storage locations on bus 15. After receiving the READY signal from controller 16 following the end of the test, host computer 14 reads the count output of each counter 24 via bus 15 and interface 27. This data does not allow host computer to determine which particular cells are defective, but it does enable host computer 14 to determine which rows or columns have defective cells, how many defective cells are in each row and column and whether any particular rows or column must be replaced. However the information is sufficient to allow host computer 14 to determine when DUT 12 does not need to be repaired, and in many cases this information will be sufficient to allow the host computer 14 to determine how to repair DUT 12 when it does need to be repaired.

After reading the count data produced by counters 24, host computer 14 takes one of the following six courses of action based on that count data:

1. When the count data indicates that there are no defective DUT cells, host computer 14 considers all cells of DUT 12 to be fully operable, ends the test process for that DUT, and logs the DUT as operable.
2. When the count data indicates that the number of rows having more defective cells than the available number of spare columns exceeds the number of available spare rows, host computer 14 determines that DUT 12 cannot be repaired, ends the test process for that DUT, and logs the DUT as not repairable.
3. When the count data indicates that the number of columns having more defective cells than the available number of spare rows exceeds the number of available spare columns, host computer 14 determines that DUT 12 cannot be repaired, ends the test process for that DUT, and logs the DUT as not repairable.
4. When the number of rows containing malfunctioning cells is less than the number of spare rows, host computer 14 assigns a spare row to replace each defective row, ends the test, and logs the DUT as fixable.
5. When the number of columns containing malfunctioning cells is less than the number of spare columns, host computer 14 assigns a spare column to replace each defective column, ends the test and logs the DUT as fixable.
6. When the counter 24 output data does not otherwise permit host computer to carry out one of options 1–5, host computer 14 determines from that data which rows or columns must be replaced by spare rows and columns. Although a defective cell can be replaced either by replacing its row with a spare row or by replacing its column with a spare column, a defective cell's row must be replaced when the number of defective cells in that row exceeds the number of spare columns. Similarly a cell's column must be replaced when the number of defective cells in a column exceed the number of available spare rows. After reserving spare rows and columns to replace the "must repair" rows and columns, host computer 14 requests tester 10 to provide the addresses of remaining defective cells not included in those "must replace" rows and columns to enable the host computer to determine how to allocate the remaining spare rows and columns so as to replace those remaining defective cells.

Obtaining Remaining Defective Cell Addresses

Tester 10 includes a "check address" stack 28 that host computer 14 can access via a stack controller 30. Host computer 14 initially sends the row address of all the "must replace" rows to stack controller 30 via bus 15 and tells the stack controller to sequentially push those row addresses onto the check address stack 28. Host computer 14 then sends a "CLEAR_ROW" command to controller 16. As discussed below in more detail, controller 16 responds to the CLEAR_ROW command by reading each row address in stack 28 and writing a "0" to each storage location within that row of ECM 22. Thereafter controller 16 returns a READY response to host computer 14. Host computer 14 then pushes the column address of every "must replace" column onto stack 28 and sends a "CLEAR_COL" command to controller 16. Controller 16 responds by reading each column address in stack 28, and writing a "0" to each storage location within that column of ECM 22. Thereafter controller 16 again returns the READY response to host computer 14.

At this point ECM 22 contains a bit map of defective DUT cells of only those rows and columns for which host computer 14 has not already assigned a spare row or column. Host computer 14 needs to know the addresses of those defective memory cells so that it can appropriately allocate the remaining unassigned spare rows and columns. Therefore, it requests tester 10 to process the data in ECM 22 and provide it with those addresses.

When there are fewer rows than columns containing faulty cells, host computer 14 pushes the row address of each row containing one or more of the remaining defective cells onto stack 28 and then sends a "SPARSE_ROW" command to controller 16 via bus 15. Otherwise when there are fewer columns than rows containing one or more of the remaining defective cells, host computer 14 pushes the column address of each column containing a defective cell onto stack 28 and sends a "SPARSE_COL" command to controller 16 via bus 15. Controller 16 responds to the SPARSE_ROW (or SPARSE_COL) command by successively read addressing each storage location of each row address (or column address) stored in stack 28. As each storage location is read addressed, ECM 22 reads out the data bit stored at that address on the FAIL_OUT data line. The FAIL_OUT line provides an input to another stack controller 32 enabled by an signal (ENABLE) asserted by controller 16. When the FAIL_OUT bit is a "1" indicating the corresponding cell of DUT 12 is defective, stack controller 32 pushes the current address appearing on the ADDRESS bus onto a "fail address" stack 34. However when the FAIL_OUT bit is a "0" indicating the DUT cell corresponding to the current ECM address is operational, controller 32 does not push that address onto fail address stack 34.

Thus after tester 10 reads every ECM 22 storage location of every row (or column) address appearing in check address stack 28, fail address stack 34 holds the address of every defective DUT cell not already included in a "must replace" row or column host computer 14 has already determined must be replaced with a spare row or column. At that point controller 16 returns another READY response to host computer 14. Computer 14 then reads the addresses of the defective cells out of fail address stack 34 via stack controller 32 and bus 15 and determines from that data how to best allocate the remaining spare rows and columns so as to repair DUT 12, if possible to do so.

Controller

Figure 3:
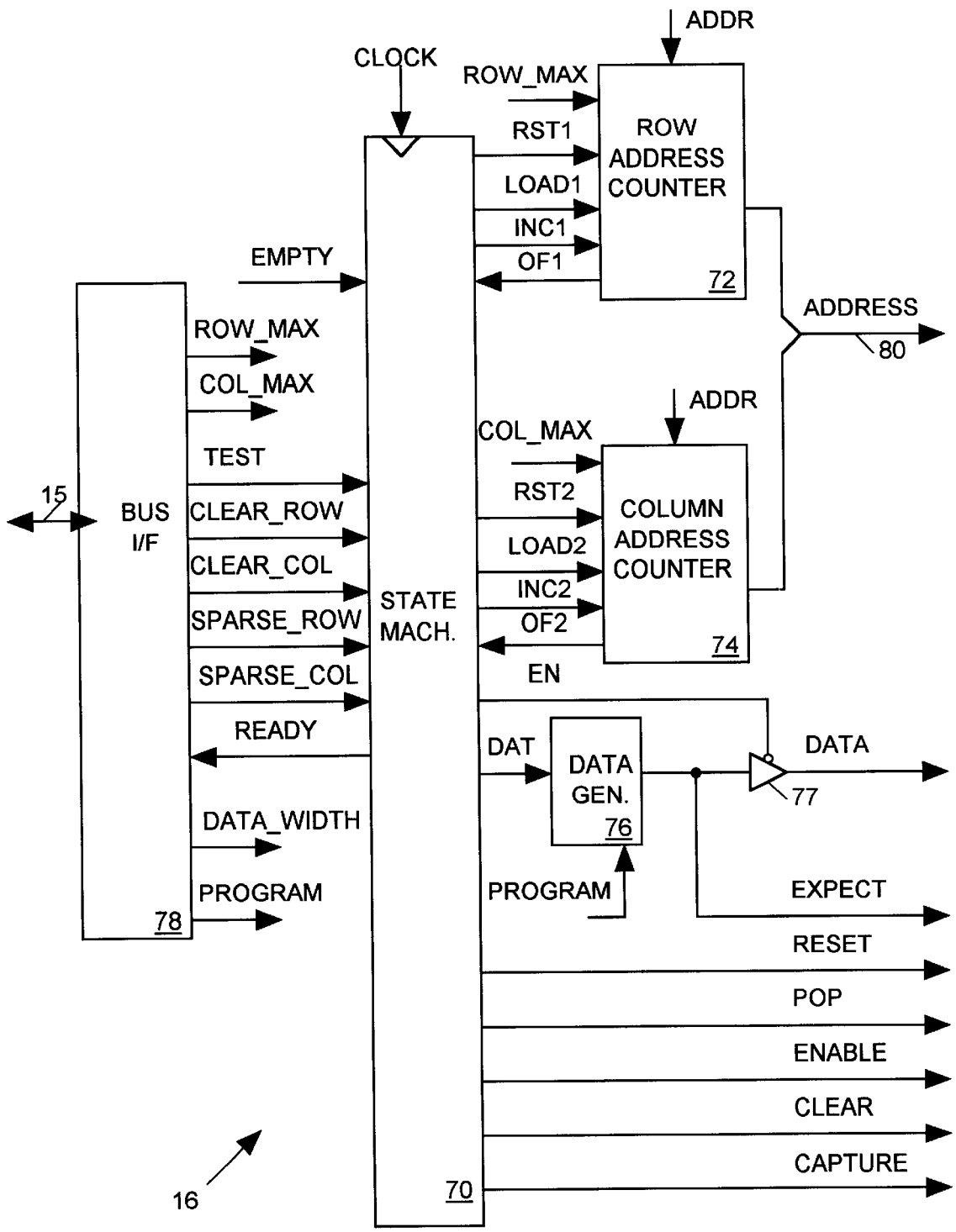
FIG. 3 illustrates the controller of FIG. 1 in more detailed block diagram form.

FIG. 3 illustrates controller 16 of FIG. 1 in more detailed block diagram form. Controller 16 includes a state machine 70 clocked by a system clock (CLOCK) for sequencing controller operations, a row address counter 72 and a column address counter 74 for generating row and column address portions of the controller's output ADDRESS field placed on an address bus 80, a data generator 76 for generating the controller's output DATA and EXPECT fields, and a bus interface circuit 78 for communicating with the host computer via bus 15.

Bus interface circuit 78 includes internal addressable registers to which host computer 14 can write data via bus 15. The data in one of those registers encodes commands from host computer 14 supplied as input bits to state machine 70. Each command tells state machine 70 to carry out a separate procedure. DUT's having variable numbers of rows and columns can be tested. A ROW_MAX data value and a COL_MAX data value stored in registers within bus interface 78 indicate the maximum row and column addresses of DUT 12. The ROW_MAX and COL_MAX data values are supplied to row and column address counters 72 and 74 to set their count limits. Bus interface circuit 78 also transmits a READY response from state machine 70 to host computer 14 in the form of an interrupt. Data generator 76 generates data test patterns during the memory test. Host computer 14 programs data generator 76 to produce a desired test data sequence by transmitting a program to data generator 76 via bus 15 and bus interface 78.

TEST Command

The TEST command tells state machine 70 to carry out the test procedure of illustrated in FIG. 2. Referring to FIGS. 1–3, state machine 70 pulses the RESET signal to reset counters 24 and to clear stacks 28 and 34 during the initialization step 40. State machine 70 also clears ECM 22 during the initialization step 40 by writing a 0 to each storage location. To do so, state machine 70 first pulses an RST1 and an RST2 signal to reset the contents of row and column address counters to 0, thereby setting the ADDRESS field on bus 80 to address row 0, column 0 of the ECM. State machine 70 then pulses the CAPTURE signal while asserting a CLEAR signal input to ECM 22. The CLEAR signal tells ECM 22 to store a 0 at its current address, rather than the FAIL_IN bit when the CAPTURE signal is asserted. State machine 70 then pulses an INC2 signal to tell address counter 74 to increment the column address so that the ADDRESS field now addresses row 0 column 1 of ECM 22. State machine 70 then asserts the CLEAR signal and pulses the CAPTURE signal to store a 0 at that address. State machine 70 continues this process until column address counter 74 reaches the COL_MAX address limit and asserts an overflow signal OF2. This signal tells state machine 70 to pulse RST2 to reset the column address count to 0, and to pulse INC1 to increment the row address count to 1. State machine 70 continues in a similar fashion to write a 0 to each ECM 22 storage location of rows 1 to ROW_MAX at which point row and column address counters 72 and 74 assert their overflow signals OF1 and OF2. State machine 70 then sends a READY response to host computer 14 via bus interface 78.

Having reset row and column counters 24, cleared stacks 28 and 34, and written 0's to all storage locations in error capture memory 22, state machine 70 operates row and column address counters 72 and 74 in a similar manner so that they successively address each cell of DUT 12 during the test. Data generator 76 generates the EXPECT field during the test. A DAT bit output of state machine 70 tells data generator 76 whether the EXPECT field is all 0's or all 1's. A tristate driver 77 selectively places the EXPECT field on the DATA bus during memory write operations in response to an enable bit EN provided by state machine 70. The data word width of DUT 12 is variable. Host computer 14 writes a data value (DATA_WIDTH) into a register within bus interface 78 indicating the data word width of DUT 12. That data is supplied to comparator 20 to indicate how many bits of the DATA and EXPECT fields are to be compared.

CLEAR_ROW, CLEAR_COL Commands

The CLEAR_ROW command tells state machine 70 to clear every row of ECM 22 for which host computer 14 has loaded a row address into the check address stack 28. State machine 70 responds to the CLEAR_ROW command by resetting column address counter 74 and pulsing a LOAD1 signal causing row address counter to load (set its output count) to the value of the first row address in stack 28. State machine 70 also pulses a POP signal input to stack controller 30 telling it to pop that row address off stack 28. With the ADDRESS field on bus 80 set to address the first storage location of the first row to be cleared, state machine 70 clears all storage locations of the row by asserting the CLEAR signal and successively incrementing the column counter 74 while pulsing the CAPTURE signal. State machine 70 then pulses a POP signal input to stack controller 30 telling it to pop the first row address off stack 28 so that the address of a second row to be cleared is available to row address counter 72. State machine 70 then loads that second row address into row address counter 72 and repeats the process to clear all storage locations of that second row. State machine 70 further repeats this process to clear all ECM storage locations of all rows addresses stored in check address stack 28. An EMPTY signal produced by stack controller 30 tells state machine 70 when stack 28 is empty. State machine 70 thereafter sends the READY response back to host computer 14. State machine 70 responds to the CLEAR_COLUMN command in a generally similar manner except that it loads column addresses from stack 28 into column address counter 74 and increments row address counter 72 to step through row addresses, thereby clearing ECM storage locations on a column-by-column bases instead of on a row-by-row basis.

SPARSE_ROW, SPARSE_COL Commands

The SPARSE_ROW command host computer 14 sends to state machine 70 tells it to read the address data in each row of ECM 22 for which host computer 14 has stored a row address in check address stack 28. State machine 70 does this by successively loading each row address from stack 28 into row address counter 72 and incrementing column address counter 74 through its full column address range for each row address. State machine 70 pulses the ENABLE signal whenever it increments the column address to permit stack controller 32 to push the current ADDRESS field onto fail address stack 34 when the currently FAIL_OUT data indicates a DUT cell failure at that address. The SPARSE_COL command from host computer 14 causes state machine 70 to carry out a similar procedure except that it loads column addresses from the check address stack 28 into column address counter 74 and increments row address counter 72 through its full row address range after each column address has been loaded.

Thus has been shown and described a memory tester 10 in accordance with the invention for testing a memory DUT 12 and for providing a host computer 14 with enough information to determine how to efficiently allocate spare rows and columns for replacing rows and columns containing defective memory cells. Memory tester 10 can provide the necessary information to host computer 14 more quickly than typical prior art testers because it presents the information in a more compact form. A typical prior art memory tester includes an error capture memory but they require a host computer to directly read access every storage location in the ECM to determine which cells are defective. Since an ECM has millions of storage locations when a DUT has millions of addressable cells, a host computer takes a long time to access the data stored in the ECM. Memory tester 10 speeds up the test process because it does not require host computer 14 to read the data in ECM 22 to determine how to allocate spare rows and columns. Since a large memory having millions of cells has only a few thousand rows and columns, the amount of data produced by counters 24 is relatively small compared to the amount of data stored in ECM 22. Thus host computer 14 can quickly access the data in counters 24. In most cases (i.e. options 1–5 above), the test process ends after host computer 14 acquires the data from counters 34 because the host computer will be able to determine a suitable allocation for spare rows and columns based solely on the data provided by counters 24. It is only when the counter data is insufficient to determine how to repair the DUT (option 6 above) that any contents of ECM 22 must be read. However even in that case contents of ECM 22 are not read by host computer 14 but by hardware within tester 10 itself which can do so quickly. Moreover not all storage locations in ECM 22 are read; tester 10 reads and processes data from only the rows (or columns) of ECM 22 corresponding to rows or columns of DUT 12 containing defective cells.

While the forgoing specification has described preferred embodiment(s) of the present invention, one skilled in the art may make many modifications to the preferred embodiment without departing from the invention in its broader aspects. For example while the preferred embodiment of tester 10 tests DUT 12 by sequentially write and read accessing the memory cells using a particular sequence of address and data patterns, it should be understood that other address and data pattern sequences could be employed. The appended claims therefore are intended to cover all such modifications as fall within the true scope and spirit of the invention.

What is claimed is:

1. An apparatus for testing a device under test (DUT) including rows and columns of memory cells to determine which of said memory cells are defective and for providing a host computer with information enabling it to determine how to allocate spare rows and columns for replacing rows and columns containing the defective memory cells, the apparatus comprising:

an error capture memory (ECM) (22) having a plurality of storage locations, each of said memory cells corresponding to a separate one of said storage locations;

first means (16, 20) for testing each memory cell of said DUT to determine whether the memory cell is defective and for writing results data into its corresponding storage location of said ECM indicating whether the memory cell is defective;

second means (24, 26) for concurrently generating a plurality of counts while said first means is testing memory cells of said DUT, each row and column of said DUT corresponding to a separate one of said counts, each count indicating a number of defective memory cells of its corresponding one of said rows and columns, and third means (15, 27) for delivering said plurality of counts to said host computer.

2. The apparatus in accordance with claim 1 wherein said first means comprises:

a row address counter (72) for generating a row address;

a column address counter (74) for generating a column address;

fourth means (80) for combining said row address and said column address to form a memory address and for delivering said memory address concurrently to said DUT and to said ECM, such that said memory address addresses one of said memory cells of said DUT and a corresponding one of said storage locations of said ECM;

fifth means (70, 76) for generating and writing input data to a memory cell of said DUT addressed by said memory address, for causing said DUT to read out output data stored by said memory cell addressed by said memory address, and for causing said ECM to store said results data at a storage location addressed by said memory address; and sixth means (20) for performing a comparison of input data written into said memory cell of said DUT to the output data read out of said memory cell of said DUT and for producing said results data supplied to said ECM in accordance with said comparison.

3. The apparatus in accordance with claim 1 further comprising means (15, 16, 28, 30, 32, 34) for reading the data written into selected storage locations of said ECM, for determining addresses of defective memory cells from the data read, and for delivering the determined addresses to said host computer.

4. A method for testing a device under test (DUT) including rows and columns of memory cells to determine which of said memory cells are defective and for providing a host computer with information enabling it to determine how to allocate spare rows and columns for replacing rows and columns containing the defective memory cells, the method comprising the steps of a. testing each memory cell of said DUT to determine whether the memory cell is defective;

b. writing results data into storage locations of an error capture memory (ECM) having a plurality of storage locations, each of said memory cells corresponding to a separate one of said storage locations, the results data written into each storage location indicating whether its corresponding memory cell is defective;

c. generating a plurality of counts concurrently with step b, each row and column of said DUT corresponding to a separate one of said counts, each count indicating a number of memory cells of its corresponding one of said rows and columns determined to be defective in step b, and d. delivering said plurality of counts to said host computer.

5. The method in accordance with claim 4 wherein each corresponding storage location and memory cell has a similar address and wherein step a comprises the substeps of:

a1. generating a sequence of addresses, a2. delivering each generated address concurrently to said ECM and said DUT, each address addressing one of said memory cells of said DUT and a corresponding one of said storage locations of said ECM;

a3. generating input data and causing said DUT to store said input data at each addressed memory cell;

a4. causing said DUT to read out output data stored by each addressed memory cell;

a5. performing a comparison of input data written into each said memory cell of said DUT to the output data read out of each said memory cell of said DUT and generating results data in accordance with said comparison; and a6. causing said ECM to store generated results data at each storage location addressed by said memory address.

6. The method in accordance with claim 4 further comprising the steps of:

e. reading the data written into selected storage locations of said ECM, f. determining addresses of defective memory cells from the data read, and g. delivering the determined addresses to said host computer.

7. An apparatus for testing a device under test (DUT) including rows and columns of addressable memory cells to determine which of said memory cells are defective and for providing a host computer with information enabling it to determine how to allocate spare rows and columns for replacing rows and columns containing the defective memory cells, the apparatus comprising:

an error capture memory (ECM) (22) having a plurality of addressable storage locations, each of said memory cells corresponding to a separate one of said storage locations;

first means (28 and 30) for storing and reading out row and column addresses;

second means (32 and 34) for storing and reading out memory addresses to said host computer;

a row address counter (72) for receiving each row address read out of said first means, for generating said row address as an output row address, and for incrementing said output row address;

a column address counter (74) for receiving each column address read out of said first means, for generating said column address as an output column address, and for incrementing said output column address, said output said row address and said output column address combining to form a memory address delivered concurrently to said DUT, to said ECM and to said second means, wherein said memory address addresses one of said memory cells of said DUT and a corresponding one of said storage locations of said ECM;

means (70, 76) for generating and writing input data to a memory cell of said DUT addressed by said memory address, for causing said DUT to read out output data stored by said memory cell addressed by said memory address, for causing said ECM to store said results data at a storage location addressed by said memory address, for causing said ECM to read out said results data at said storage location addressed by said memory address, and for causing said second means to store said memory address in response to said results data;

means (20) for performing a comparison of input data written into said memory cell of said DUT to the output data read out of said memory cell of said DUT and for producing said results data supplied to said ECM in accordance with said comparison;

a plurality of counters, each row and column of said DUT corresponding to a separate one of said counters, each counter generating a count indicating a number of defective memory cells of its corresponding one of said rows and columns; and means for delivering the count generated by each of said counters to said host computer.

8. A method for allocating spare rows and columns of memory cells for replacing rows and columns of memory cells of a device under test (DUT), the method comprising the steps of:

a. testing memory cells of said DUT to determine which memory cells are defective and writing results data into storage locations of an error capture memory (ECM) including rows and columns of storage locations, wherein each memory cell of said DUT corresponds to a separate one of said locations of said ECM, and wherein the results data written into each storage location indicates whether its corresponding memory cell is defective;

b. generating a plurality of counts concurrently with step a, wherein each count indicates a number of memory cells of a corresponding one of said rows and columns determined to be defective in step a;

c. allocating at least one of said spare rows and columns of memory cells of said DUT to replace at least one of said rows and columns of memory cells of said DUT having at least one defective cell in response to said plurality of counts generated at step b; and d. altering results data in storage locations of the at least one of said rows and columns of storage locations of said ECM to which said at least one of said spare rows and columns of memory cells is allocated in step c such that said results data indicates that none of the memory cells of a corresponding row or column of said DUT are defective.

9. The method in accordance with claim 8 further comprising the step of:

e. after step d, reading results data stored in ones of said rows and columns of storage locations of said ECM corresponding to ones of said rows and columns of memory cells containing defective memory cells as indicated by said plurality of counts generated at step b.

10. The method in accordance with claim 9 further comprising the steps of:

f. determining from the results data read at step e which of said rows and columns of memory cells of said ECM include defective memory cells; and g. allocating at least one other of said spare rows and columns for replacing rows and columns of memory cells of said ECM determined at step f to include defective memory cells.

* * * * *